(12) United States Patent
Aggus et al.

(10) Patent No.: US 6,322,175 B1
(45) Date of Patent: Nov. 27, 2001

(54) CIRCUIT CARD ENCLOSURE WITH INTEGRAL CIRCUIT CARD GUIDES AND HEAT DISSIPATION APERTURES

(75) Inventors: Trevor J. Aggus, Lincroft; Matthew J. Gawron, Jackson, both of NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/473,768

(22) Filed: Dec. 29, 1999

(51) Int. Cl.[7] .............................. A47B 97/00; H05K 7/14
(52) U.S. Cl. .................................... 312/223.2; 312/223.1; 361/802; 361/756; 211/41.17
(58) Field of Search ........................... 312/223.1, 223.2, 312/263, 265.5; 361/756, 752, 796, 801, 802; 211/41.17, 26; 439/59, 64, 325, 345, 377

(56) References Cited

U.S. PATENT DOCUMENTS

| | | | |
|---|---|---|---|
| 4,519,016 | * | 5/1985 | Bradley et al. ............... 211/41.17 X |
| 4,758,928 | * | 7/1988 | Wierec et al. ................ 211/41.17 X |
| 5,400,214 | * | 3/1995 | Antonuccio et al. ............ 361/756 X |
| 5,467,254 | * | 11/1995 | Brusati et al. .................... 361/802 X |
| 5,696,668 | * | 12/1997 | Zenitani et al. ..................... 361/802 |
| 5,816,673 | * | 10/1998 | Sauer et al. .................. 312/223.1 X |
| 6,088,232 | * | 7/2000 | Ho .................................... 361/756 X |

\* cited by examiner

*Primary Examiner*—Peter M. Cuomo
*Assistant Examiner*—James O. Hansen
(74) *Attorney, Agent, or Firm*—David L. Davis

(57) ABSTRACT

A circuit card enclosure formed of sheet metal with its top and bottom walls having integrally formed circuit card guides. The guides are lanced and formed projections extending inwardly from the top and bottom walls and are spaced from the respective walls by a distance satisfying regulatory requirements for sizes of opening in such enclosures. Additionally, the top and bottom walls have apertures for heat dissipation purposes which likewise satisfy the regulatory requirements. Thus, the enclosure does not require an additional top cover or shield.

4 Claims, 2 Drawing Sheets

CIRCUIT CARD ENCLOSURE WITH INTEGRAL CIRCUIT CARD GUIDES AND HEAT DISSIPATION APERTURES

BACKGROUND OF THE INVENTION

This invention relates to circuit card enclosures and, more particularly, to such an enclosure wherein the top and bottom walls are formed with integral circuit card guides and heat dissipation apertures which satisfy regulatory requirements without requiring an additional top cover member.

Complex electronic systems typically include a rectilinear sheet metal enclosure for the circuit cards making up the electronic system. Usually, a backplane board is supported along a back wall of the enclosure and card guides are provided on the top and bottom walls of the enclosure so that the circuit cards making up the electronic system can be slid into the enclosure for mating engagement with connectors provided on the backplane board. Since electronic components generate heat which must be dissipated from the enclosure, the top and bottom walls of the enclosure are usually provided with openings to allow the heat to escape. To minimize costs, the card guides are often formed directly from the sheet metal making up the top and bottom walls of the enclosure. These card guides are typically formed as a large opening which is cut and folded to form guides flanking the opening. However, regulatory agencies, such as Underwriters Laboratory (UL), have strict requirements on the maximum allowable size of openings on the top of such an enclosure. In particular, paragraph 4.3.15 of UL Standard 1950 requires that openings directly over bare parts at hazardous voltage shall not exceed five millimeters in any dimension or not exceed one millimeter in width regardless of length. In the past, to satisfy such a requirement, an additional cover or shield was added to the enclosure. It would therefore be desirable to provide an enclosure design which meets the regulatory requirements concerning allowable sizes of openings without requiring an additional cover or shield.

SUMMARY OF THE INVENTION

According to the present invention, there is provided a sheet metal wall adapted for use as a top wall of a circuit card enclosure. The sheet metal wall comprises a sheet metal plate formed with at least one pair of opposed dogleg-shaped lanced projections extending from a first side of the plate to leave a space between the first side of the plate and the projection of no more than one millimeter. The plate is further formed with a plurality of spaced apertures each of a size not exceeding five millimeters in any dimension or not exceeding one millimeter in width regardless of length. Accordingly, each pair of projections functions as a circuit card guide and the plurality of apertures allow heat dissipation therethrough so that the plate satisfies the requirements set forth in Underwriters Laboratory Standard 1950, paragraph 4.3.15, without requiring an additional top cover member.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
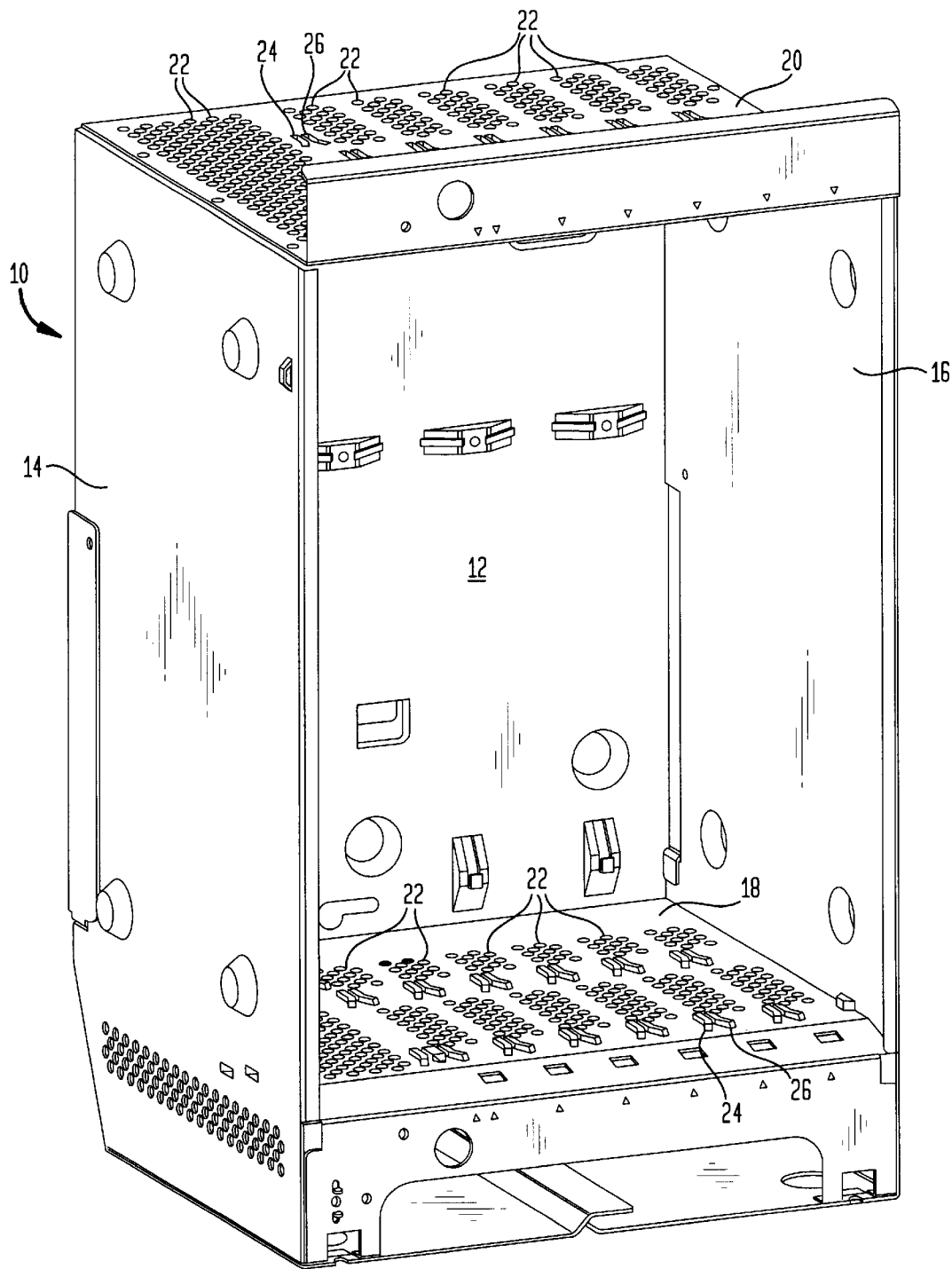
FIG. 1 is a perspective view of a circuit card enclosure constructed according to the principles of this invention.
Figure 2:
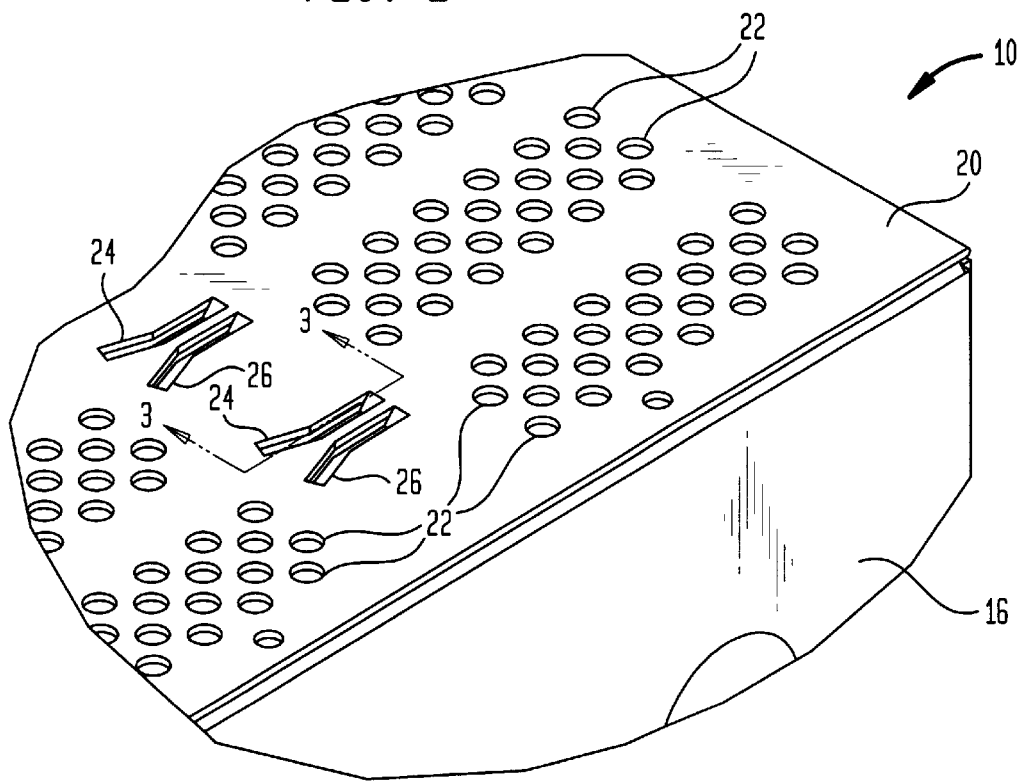
FIG. 2 is an enlarged perspective view showing a portion of the top wall of the enclosure shown in FIG. 1.

FIG. 1 shows a rectilinear enclosure, designated generally by the reference numeral 10, for holding circuit cards and constructed according to the present invention. The enclosure 10 includes a rectangular sheet metal back wall 12 adapted to hold a backplane board (not shown) with the backplane board parallel to the wall 12. The enclosure 10 further includes a parallel pair of rectangular sheet metal side walls 14, 16 which extend perpendicular to the back wall 12 and forwardly from the back wall 12. Each of the side walls 14, 16 is secured to a respective one of the side edges of the back wall 12. The enclosure 10 also includes a rectangular sheet metal bottom wall 18 which extends perpendicular to and forwardly from the back wall 12. The bottom wall 18 is secured to the lower edge of the back wall 12 and is also secured along each of its opposed lateral edges to a respective one of the pair of side walls 14, 16. Still further, the enclosure 10 includes a rectangular sheet metal top wall 20 which extends perpendicular to and forwardly from the back wall 12. The top wall 20 is secured to the upper edge of the back wall 12 and is secured along each of its opposed lateral edges to a respective one of the pair of side walls 14, 16. Thus, a rectilinear box-like structure is provided for the enclosure 10.

As shown in the drawings, both the bottom wall 18 and the top wall 20 are formed with a plurality of spaced apertures 22. The apertures 22 are for the purpose of letting heat escape from within the interior of the enclosure 10. Illustratively, each of the apertures 22 is circular with a diameter of 4.77 millimeters, which satisfies the Underwriters Laboratory requirement discussed above.

Figure 3:
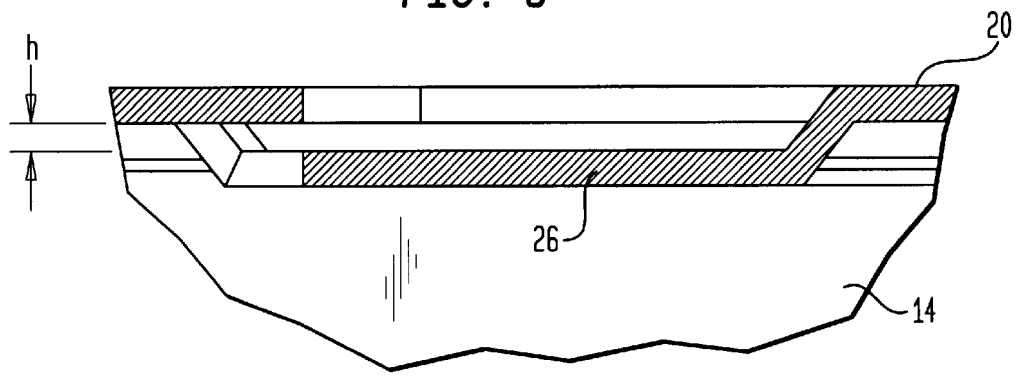
FIG. 3 is a cross sectional view taken along the line 3—3 in FIG. 2.

Card guides are provided in the bottom wall 18 and the top wall 20 so that circuit cards can be slid into the enclosure 10 for engagement with the backplane, as is conventional in the art. According to the presents invention, each card guide is formed by a pair of opposed dogleg-shaped lanced projections 24, 26 which extend inwardly of the enclosure 10 from its respective wall 18, 20. Thus, each of the card guides is formed from the opposed pair of dogleg-shaped projections 24, 26 as a Y-shaped slot. The projections 24, 26 forming the card guides are spaced on the walls 18, 20 so that the circuit cards are held parallel to the side walls 14, 16. In order to satisfy the aforedescribed Underwriters Laboratory requirement, the spacing "h" (FIG. 3) between each projection 24, 26 and its respective wall 18, 20 is illustratively equal to 0.97 millimeter.

Accordingly, there has been disclosed an improved circuit card enclosure. By forming the openings in the top and bottom walls and the card guides as described, regulatory requirements for the top of such an enclosure are satisfied without requiring an additional top cover or shield, resulting in a significant cost reduction. While an illustrative embodiment of the present invention has been disclosed herein, it is understood that various adaptations and modifications to the disclosed enclosure are possible and it is intended that this invention be limited only by the scope of the appended claims.

What is claimed is:

1. A rectilinear enclosure for holding at least one circuit card, comprising:

a rectangular sheet metal back wall having a pair of side edges, a lower edge and an upper edge, said back wall adapted for supporting a backplane board thereon with the backplane board parallel to the back wall;

a parallel pair of rectangular sheet metal side walls extending perpendicular to and forwardly from said back wall, and each secured to a respective one of the side edges of said back wall;

a rectangular sheet metal bottom wall extending perpendicular to and forwardly from said back wall, secured to the lower edge of said back wall and secured along each of its opposed lateral edges to a respective one of said pair of side walls; and a rectangular sheet metal top wall extending perpendicular to and forwardly from said back wall, secured to the upper edge of said back wall and secured along each of its opposed lateral edges to a respective one of said pair of side walls;

wherein each of the top and bottom walls includes at least one circuit card guide formed integrally with the respective one of the top and bottom walls, said at least one circuit card guide including a pair of opposed dogleg-shaped lanced projections extending inwardly of the enclosure from its respective wall and leaving a space between each projection and its respective one of the top and bottom walls of no more than one millimeter, and each of the top and bottom walls is formed with a plurality of spaced apertures each of a size not exceeding five millimeters in any dimension or not exceeding one millimeter in width regardless of length;

whereby the enclosure provides integral card guides and heat dissipation apertures that satisfy the requirements set forth in Underwriters Laboratory Standard 1950, paragraph 4.3.15, without requiring an additional top cover member.

2. The enclosure according to claim 1 wherein each of the apertures is circular with a diameter not exceeding five millimeters.

3. The enclosure according to claim 1 wherein the circuit card guides are arranged to hold a respective circuit card parallel to the side walls.

4. A sheet metal wall adapted for use as a top wall of a circuit card enclosure, the sheet metal wall comprising:

a sheet metal plate formed with at least one pair of opposed dogleg-shaped lanced projections extending from a first side of said plate to leave a space between said first side of said plate and said projection of no more than one millimeter, each pair of projections forming a respective Y-shaped slot, and said plate being formed with a plurality of spaced apertures each of a size not exceeding five millimeters in any dimension or not exceeding one millimeter in width regardless of length;

wherein each pair of projections functions as a circuit card guide and said plurality of apertures allow heat dissipation therethrough.

* * * * *